(12) United States Patent
Mayer

(10) Patent No.: US 10,481,230 B2
(45) Date of Patent: Nov. 19, 2019

(54) NMR SHIM SYSTEM

(71) Applicant: Bruker BioSpin AG, Faellanden (CH)

(72) Inventor: Markus Mayer, Gossau (CH)

(73) Assignee: BRUKER SWITZERLAND AG, Faellanden (CH)

(*) Notice: Subject to any disclaimer, the term of this patent is extended or adjusted under 35 U.S.C. 154(b) by 0 days.

(21) Appl. No.: 16/232,569

(22) Filed: Dec. 26, 2018

(65) Prior Publication Data

US 2019/0204399 A1    Jul. 4, 2019

(30) Foreign Application Priority Data

Jan. 4, 2018  (DE) .................. 10 2018 200 098

(51) Int. Cl.
| | | |
|---|---|---|
| *G01V 3/00* | (2006.01) | |
| *G01R 33/3875* | (2006.01) | |
| *H01F 41/098* | (2016.01) | |
| *G01R 33/44* | (2006.01) | |

(52) U.S. Cl.
CPC ....... *G01R 33/3875* (2013.01); *G01R 33/443* (2013.01); *H01F 41/098* (2016.01)

(58) Field of Classification Search
CPC .................................................. G01R 33/3875
USPC ................................................. 324/318, 322
See application file for complete search history.

(56) References Cited

U.S. PATENT DOCUMENTS

| | | | |
|---|---|---|---|
| 3,735,306 A | 5/1973 | Kabler et al. | |
| 5,630,415 A * | 5/1997 | Kaufman | G01R 33/385 |
| | | | 324/318 |
| 6,011,394 A * | 1/2000 | Petropoulos | G01R 33/4215 |
| | | | 324/318 |
| 6,711,430 B1 | 3/2004 | Ferris et al. | |
| 7,288,939 B1 * | 10/2007 | Barbara | G01R 33/31 |
| | | | 324/318 |

(Continued)

FOREIGN PATENT DOCUMENTS

| | | |
|---|---|---|
| CN | 104865544 A | 8/2015 |
| DE | 2152006 C2 | 4/1972 |

(Continued)

OTHER PUBLICATIONS

German Office Action with English translation, DE 10 2018 200 098.0, dated Nov. 9, 2018, 12 pages.

*Primary Examiner* — Louis M Arana
(74) *Attorney, Agent, or Firm* — Edell, Shapiro & Finnan, LLC

(57) ABSTRACT

A shim system for influencing and homogenizing the magnetic field of an NMR system includes a coil former (1), an extension tube (2) and a terminal unit (3), as well as partial coils (4, 4a) that are mounted on the coil former. Terminal lines (6a, 6b) for connecting the partial coils to the terminal unit are initially electrically disconnected from one another between the coil former and the extension tube. A circuit board (5) with connection lines (5a, 5b, 5c, 5d), however, is interposed between the disconnected terminal lines. This makes it possible to redesign the shim system in the mechanical construction thereof using simple technical measures and standard components, and without giving rise to significant additional costs. Therefore, production of the partial windings on the coil former can take place in a simplified, economical and automated manner, without requiring an extension tube to be already fitted.

14 Claims, 1 Drawing Sheet

(56) References Cited

U.S. PATENT DOCUMENTS

| | | | |
|---|---|---|---|
| 2004/0051612 A1* | 3/2004 | Herndon | H01F 6/06 335/299 |
| 2004/0194293 A1 | 10/2004 | Begg | |
| 2011/0316535 A1 | 12/2011 | Price et al. | |
| 2012/0317795 A1* | 12/2012 | Fath | G01R 33/3858 29/605 |

FOREIGN PATENT DOCUMENTS

| | | |
|---|---|---|
| JP | S60153111 A | 8/1985 |
| JP | S63237508 A | 10/1988 |
| JP | 2001218750 A | 8/2001 |
| JP | 2004305736 A | 11/2004 |

* cited by examiner

NMR SHIM SYSTEM

CROSS REFERENCE TO RELATED APPLICATIONS

This application claims foreign priority under 35 U.S.C. § 119(a)-(d) to German Application No. DE 10 2018 200 098 filed on Jan. 4, 2018, the entire contents of which are hereby incorporated into the present application by reference.

FIELD OF THE INVENTION

The invention relates to a shim system, in particular a coil system, for influencing and homogenizing the magnetic field of a Nuclear Magnetic Resonance (NMR) system that includes a coil former, an extension tube and a terminal unit, as well as comprising partial coils that are mounted on the coil former and have terminal lines to the terminal unit, and to a method for producing a shim system of this kind.

BACKGROUND

A shim system of this kind is known, for example, from CN 104865544 A from WUHAN ZHONGKE MR TECHNOLOGY CO LTD (=reference [1]) and from U.S. Pat. No. 3,735,306 A or DE 21 52 006 C2 from VARIAN ASSOCIATES, INC. (=reference [2]).

NMR methods are used to analyze sample compositions or to determine the structure of materials in samples. NMR spectroscopy is an efficient method of instrumental analysis. In such NMR methods, the sample is exposed to a strong static magnetic field $B_0$ in a Z direction, and, in addition, orthogonal high-frequency electromagnetic pulses are irradiated into the sample in the X or Y direction. This results in an interaction with the nuclear spin of the sample material. The development of this nuclear spin of the sample over time in turn produces high-frequency electromagnetic fields, which are detected in the NMR apparatus. Information regarding the properties of the sample can be obtained from the detected HF fields. In particular, the chemical bonding behaviors in the sample can be inferred from the position and intensity of NMR lines.

The homogeneity of the strong static magnetic field $B_0$ in the Z direction is decisive for the quality of the measurement. Complex coil systems are used to influence and homogenize the magnetic field of an NMR system, and are known as shim systems.

FIG. 1 shows a simplified shim system according to the existing conventional art. The figure shows only the partial coils that influence the static magnetic field $B_0$ in the Z direction.

The production of the partial coils and the connections of these partial coils to the terminal unit takes place on winding machines. For this purpose, the coil former, the extension tube and parts of the connection unit are assembled in advance and this pre-assembled unit is clamped on the winding machine.

The winding then takes place such that a wire is fixed to the terminal unit as a connection line and is guided therefrom along and in longitudinal grooves of the extension tube and of the coil former as far as the first peripheral groove of the first partial coil, which groove is the most remote from the terminal unit. This partial coil is then wound using the same wire. This same wire, again as a connection line, is then guided back in the same manner to the terminal unit and fixed there.

Following this, the further partial coils are produced in the same manner. The terminal lines to the foregoing partial coils come to lie under the further partial coils.

The process is made more complicated if two non-adjacent partial coils have to be connected in series. In this case, the first of the two partial coils firstly has to be wound as previously described. The terminal line is then guided back, but not as far as the terminal unit; instead, the wire reel, from which the wire for the terminal line is unwound, provisionally has to be fixed near the terminal unit such that, when the following partial coils are being wound, it turns therewith but is not unwound further. The partial coils which are located between the partial coils to be connected in series are then produced. Following this, the wire reel is re-received and the second of the coils connected in series is wound and the wire is then guided to and fixed to the terminal unit as a terminal line. If two partial coils connected in series obtain a different polarity, the two partial coils have to be mounted in different winding directions.

This is disadvantageous in that this procedure is so complicated that this production process can no longer be automated with reasonable effort.

Shim coils that are produced according to the conventional teachings described above are also disadvantageous in that the coil former already has to be connected to the extension tube before the time-consuming winding process. Since there are extension tubes of lengths that differ depending on the required length of the shim system, it therefore already has to be definitively decided at that point what shim system length should be made.

It is currently not possible to make-to-stock the time-consuming windings of the partial coils in advance. In such a case, it would be possible to produce a shim coil much more rapidly after receiving an order because then only a coil former already equipped with its partial coils would have to be fitted with the correct extension tube and the remaining parts. Instead, only a complex manual production in the manner described above is possible according to the conventional teachings.

SUMMARY

Accordingly, one object addressed by the present invention is to redesign the shim system in the mechanical construction thereof using simple technical measures and standard components and without significant additional costs, such that the production of the partial coils on the coil former can take place without requiring an extension tube to be fitted already, and as economically as possible in a simplified and automated manner.

This object is addressed in a manner that is both surprisingly simple and effective in that the terminal lines are disconnected from one another between the coil former and the extension tube and are reconnected to one another through an interposed circuit board with connection lines.

This makes it possible for the partial coils to be wound onto the coil former without requiring that an extension tube and parts of the terminal unit are already fitted previously, in order to be able to fix the ends of the terminal lines. In addition, the production process is standardized for all partial coils. Furthermore, there is no longer a need for a complicated process to connect a plurality of partial coils in series. If two partial coils connected in series obtain a different polarity, this can be resolved simply by suitably arranging the connection lines on the circuit board.

In a preferred embodiment of the shim coil according to the invention, the terminal lines disconnected from each other between the coil former and the extension tube are reconnected by being soldered to one another through the interposed circuit board with solder points and connection lines.

For this purpose, the circuit board can carry additional, supplementary and further connection lines as well as solder points for connecting the terminal lines from the partial coils for the serial connection of two or more partial coils.

Further advantageous embodiments are characterized in that the terminal lines electrically disconnected from each other between the coil former and the extension tube are electrically reconnected to one another by the interposed circuit board using clamp, screw or plug connections. This allows different connection techniques to be taken into account, especially if these techniques are to be automated.

Embodiments in which the circuit board contains not only the connection line of the terminal lines to the partial coils and the terminal lines to the terminal unit, but also additional connection lines for the serial connection of individual partial coils, are particularly preferred. In this way, the production of a plurality of partial coils connected in series takes place in exactly the same way as an individual coil, which simplifies automated production in particular.

In a class of embodiments of the shim coil according to the invention, the circuit board can also be designed as a flexible circuit board and can be arranged at the periphery around the lower end of the coil former. This allows for optimal utilization of the available space. There is sufficient spacing for all solder points, without a lot of space being required in the axial direction.

An embodiment of the invention in which, in addition to the solder points and connection lines for the partial coils, solder points and connection lines for other purposes, such as temperature sensors, are also arranged on the flexible circuit board, is particularly preferred. This allows the coil former to undergo further pre-assembly, not only with the partial coils, but also with further elements.

A further advantageous embodiment of the invention is obtained if the circuit board, in addition to solder pads for the terminal lines, also contains contact points with the corresponding connection lines for testing the fully wound partial coils. This makes it possible to construct a test device in which a coil former equipped with all the partial coils and further elements can be easily tested.

An arrangement of the—preferably flexible—circuit board in which, after fitting the extension tube, the solder connections of the terminal lines to the partial coils and sensors are arranged on the circuit board in a protected manner is particularly preferred. This is achieved by a design in which (as shown in FIG. 2) the extension tube projects over the region of the coil former to which the flexible circuit board is fastened. This prevents damage, in particular when the shim coil is being transported to or when being installed into the magnet.

A further improvement in performance over the conventional arrangements is also achieved in that the terminal lines from the circuit board to the terminal unit are produced with a larger diameter than the terminal lines from the partial coils to the circuit board. Since the terminal lines from the partial coils to the circuit board are produced as one piece with the partial coils themselves, the line diameter thereof is restricted by the spatial relations of the partial coils. Subdividing the terminal wires allows different wire diameters to be used for the two parts. This reduces the overall electrical resistance of the individual partial coils and the terminal lines thereof such that larger currents can flow at a given supply voltage, and thus the performance of the partial coils can be enhanced.

It is useful for an automated production of the partial coils if wire-holding devices are arranged after the grooves for the partial coils and on the space for the circuit board. This allows the wire for the partial coils and terminal lines from the partial coils to the circuit board to be mounted and wound in a single operation without interruption. In this operation, the wire is first fixed to the first wire-holding device, guided to the first partial coil position, the first partial coil is wound and then guided back to and fixed to the second wire-holding devices. Subsequently, the wire is guided to and fixed to the third wire-holding device, guided to the second partial coil position, the second partial coil is wound and then guided back to and fixed to the fourth wire-holding devices. The same method is used for the remaining partial coils. In this method, the wire is always guided via the circuit board and precisely via the appropriate solder point. Subsequently, this wire can be soldered to all the solder points and the wire pieces can ultimately be removed again from the solder points to the wire-holding devices. This allows the production of the coil windings on the coil former to take place as economically as possible and in an automated manner.

A method for producing a shim system according to the invention comprising a coil former (of the above-mentioned type) also falls within the scope of the present invention and comprises the following steps:
a) providing the coil former having a circuit board thereon;
b) connecting a terminal line to one of the wire-holding devices of the coil former;
c) running the terminal line to an upper end of a partial coil region for partial coils having an uneven number of layers or to a lower end of a partial coil region for partial coils having an even number of layers;
d) winding a partial coil having one or more layers towards a lower end of the partial coil region that faces the circuit board;
e) running the terminal line to one of the wire-holding devices;
f) running the terminal line to one of the further wire-holding devices for the following partial coil;
g) repeating steps c) to f) for every partial coil;
h) connecting all the terminal lines to the circuit board;
i) removing the terminal line parts running between the circuit board and the wire-holding devices; and
j) fitting the extension tube and the terminal unit and connecting all the terminal lines to the circuit board to the terminal unit.

This method is advantageous in that all the partial coils can be wound using a single wire in a continuous process, which is particularly efficient.

A variant of this method in which production steps b) to g) are carried out in a completely automated manner is particularly advantageous. This allows for a shim coil of better quality to be produced in a shorter amount of time and at a lower cost than according to conventional teachings.

Further advantages of the invention can be found in the description and the drawings. Likewise, the features according to the invention that are mentioned above and set out in the following can each be used individually per se or together in any desired combinations. The embodiments shown and described are not to be understood as an exhaustive list, but instead are of an exemplary nature for describing the invention.

BRIEF DESCRIPTION OF THE DRAWINGS

The invention is illustrated in the drawings and is explained in greater detail with reference to the embodiments. In the drawings.

DETAILED DESCRIPTION

Figure 1:
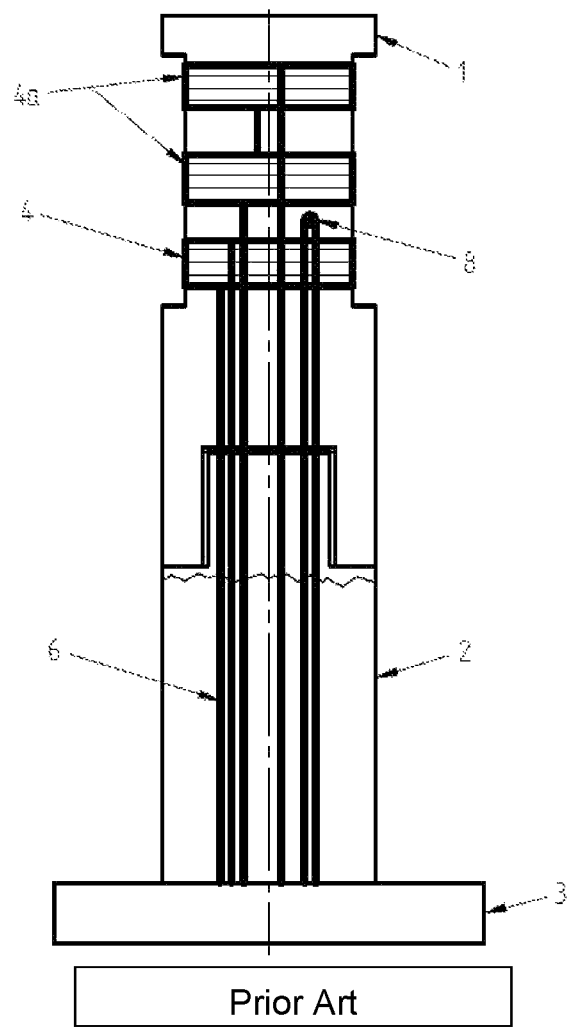
FIG. 1 is a schematic side view of a conventional shim system.

FIG. 1 systematically shows an existing design of a conventional shim system. It is made up of a coil former 1, an extension tube 2 and a terminal unit 3. The individual partial coils 4 mounted onto the coil former 1 and the terminal lines 6 each consist of one continuous wire. This also applies to partial coils 4a connected in series. The terminal lines to a sensor 8 consist of two continuous wires. The terminal lines continuously lead up to the terminal unit 3. The partial coils 4a connected in series are wound directly in series.

Figure 2:
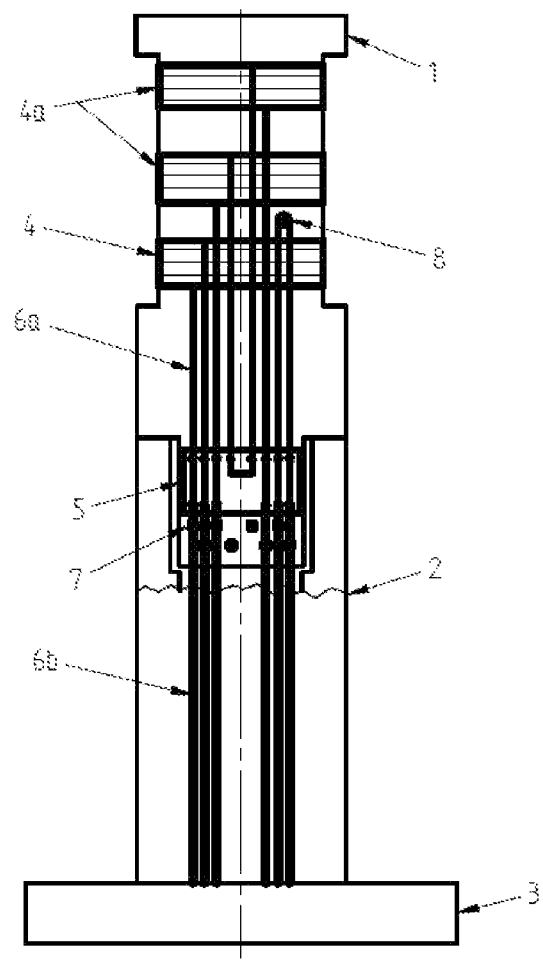
FIG. 2 shows an exemplary embodiment of a shim system according to the invention.

FIG. 2 schematically shows a possible embodiment of the shim system according to the present invention. It is likewise made up of a coil former 1, an extension tube 2 and a terminal unit 3. In addition, a circuit board 5 is provided according to the invention. Furthermore, the terminal lines in the invention, in contrast with the continuous terminal lines 6 according to the conventional technology, are subdivided into terminal lines 6a from the partial coils 4, 4a to the circuit board 5 and terminal lines 6b from the circuit board 5 to the terminal unit 3. The partial coils 4 mounted onto the coil former 1 and the terminal lines 6 consist of one continuous wire. In the partial coils 4a connected in series, the terminal lines 6a, 6b are arranged in the same manner. The serial connection occurs only on the circuit board 5. Wire-holding devices 7 are arranged after the grooves for the partial coils 4 and the space for the circuit board 5.

Figure 3:
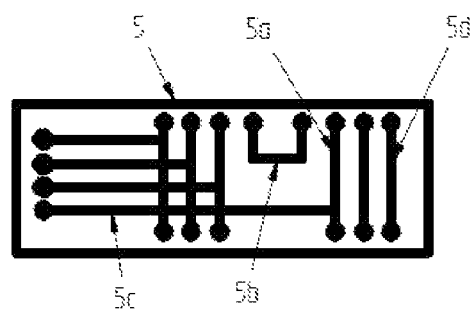
FIG. 3 is a schematic plan view of a circuit board of the shim system according to the invention.

FIG. 3 schematically shows a circuit board 5 of the shim system according to the invention. On this circuit board, there are the connection lines 5a having solder points for the terminal lines 6a and 6b, the additional connection lines 5b having solder points for the terminal lines 6a of two partial coils 4a connected in series, the further connection lines 5c having contact points for connecting partial coils 4, 4a to a testing device, and the supplementary connection lines 5d for the terminal lines 6a and 6b to, for example, a temperature sensor 8.

LIST OF REFERENCE SIGNS (1) coil former
(2) extension tube
(3) terminal unit
(4) partial coils
(4a) two or more partial coils connected in series
(5) MAS rotor with introduced substance to be examined
(5) circuit board
(5a) connection line on the circuit board having solder points for the terminal lines (6a) and (6b) from partial coils to the terminal unit
(5b) additional connection lines on the circuit board having solder points for the serial connection of terminal lines (6a) of two partial coils
(5c) further connection lines on the circuit board having contact points for connecting partial coils to a testing device
(5d) supplementary connection lines on the circuit board having solder points for the terminal lines (6a) and (6b) of, for example, temperature sensors (8)
(6) terminal lines from the partial coils to the terminal unit
(6a) terminal lines from the partial coils to the circuit board
(6b) terminal lines from the circuit board to the terminal unit
(7) wire-holding devices
(8) sensor, for example temperature sensor

LIST OF REFERENCES

[1] CN 104865544 A
[2] U.S. Pat. No. 3,735,306 A, DE 21 52 006 C2

What is claimed is:

1. A shim system for influencing and homogenizing the magnetic field of a Nuclear Magnetic Resonance (NMR) system, comprising:
    a coil former, an extension tube and a terminal unit,
    partial coils mounted on the coil former and having terminal lines configured to connect the partial coils to the terminal unit,
    wherein the terminal lines are disconnected from one another between the coil former and the extension tube, and
    a circuit board interposed between the coil former and the extension tube, and having connection lines interconnecting the terminal lines to one another.

2. The shim system according to claim 1, wherein the interposed circuit board interconnects the terminal lines between the coil former and the extension tube to one another with a plurality of solder points and the connection lines.

3. The shim system according to claim 1, wherein the interposed circuit board electrically interconnects the terminal lines between the coil former and the extension tube to one another with at least one of: clamp connections, screw connections or plug connections.

4. The shim system according to claim 1, wherein the interposed circuit board comprises at least one first connection line of the terminal lines to the partial coils, at least one second connection line of the terminal lines to the terminal unit, and additional connection lines to connect individual ones of the partial coils electrically in series with one another.

5. The shim system according to claim 1, wherein the circuit board is a flexible circuit board fastened at a periphery around a lower end of the coil former.

6. The shim system according to claim 5, wherein the flexible circuit board is arranged on the coil former such that the flexible circuit board comprises shielded solder connections of the terminal lines to the partial coils and to sensors.

7. The shim system according to claim 2, wherein, in addition to the solder points and the connection lines for the partial coils, the circuit board comprises further solder points and supplementary connection lines.

8. The shim system according to claim 7, wherein the further solder points and the supplementary connection lines electrically connect the terminal lines to at least one temperature sensor.

9. The shim system according to claim 7, wherein the circuit board, in addition to solder pads for the terminal lines, also comprises contact points with corresponding ones of the supplementary connection lines configured to test fully wound partial coils.

10. The shim system according to claim 1, wherein the terminal lines from the circuit board to the terminal unit have a different wire diameter than do the terminal lines from the partial coils to the circuit board.

11. The shim system according to claim 10, wherein the terminal lines from the circuit board to the terminal unit have a larger wire diameter than do the terminal lines from the partial coils to the circuit board.

12. A coil former for a shim system as claimed in claim 1, comprising wire-holding devices arranged in a vicinity of grooves configured to receive the terminal lines and in a vicinity of a space configured to receive the circuit board.

13. A method for producing a shim system comprising a coil former, an extension tube and a terminal unit, said method comprising:
   a) providing the coil former with a circuit board and wire-holding devices thereon;
   b) connecting a terminal line to one of the wire-holding devices of the coil former;
   c) running the terminal line to an upper end of a partial coil region for partial coils having an uneven number of layers or to a lower end of a partial coil region for partial coils having an even number of layers;
   d) winding a partial coil having one or more layers towards a lower end of the partial coil region that faces the circuit board;
   e) running the terminal line to one of the wire-holding devices;
   f) running the terminal line to a further one of the wire-holding devices for a further partial coil;
   g) repeating steps c) to f) for each additional partial coil and each additional terminal line;
   h) connecting all the terminal lines to the circuit board;
   i) removing the terminal line parts running between the circuit board and the wire-holding devices; and
   j) fitting the extension tube and the terminal unit into the shim system and connecting all the terminal lines that run to the circuit board to the terminal unit.

14. The method according to claim 11, wherein the steps b) through g) are executed in an automated production sequence.

* * * * *